United States Patent
Sievers et al.

(10) Patent No.: US 11,799,467 B2
(45) Date of Patent: Oct. 24, 2023

(54) DEVICE INCLUDING POWER TRANSISTOR AND OVERCURRENT DETECTION LOGIC AND METHOD FOR OPERATING A POWER TRANSISTOR

(71) Applicant: Infineon Technologies AG, Neubiberg (DE)

(72) Inventors: Markus Sievers, Villach (AT); Michael Glavanovics, Villach (AT); Dethard Peters, Hoechstadt (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/565,552

(22) Filed: Dec. 30, 2021

(65) Prior Publication Data

US 2022/0224323 A1    Jul. 14, 2022

(30) Foreign Application Priority Data

Jan. 12, 2021   (EP) ..................... 21151076

(51) Int. Cl.
*H03K 17/082* (2006.01)
*H02H 3/08* (2006.01)

(52) U.S. Cl.
CPC ........... *H03K 17/0822* (2013.01); *H02H 3/08* (2013.01)

(58) Field of Classification Search
CPC ......... H03K 17/0822; H02H 3/08; H02H 9/02
See application file for complete search history.

(56) References Cited

U.S. PATENT DOCUMENTS

| | | | | |
|---|---|---|---|---|
| 5,030,844 | A * | 7/1991 | Li | H03K 17/567 307/115 |
| 2008/0018310 | A1 * | 1/2008 | Lee | H03K 17/082 323/235 |
| 2017/0214313 | A1 | 7/2017 | Kikuchi | |
| 2019/0140630 | A1 | 5/2019 | Chen et al. | |

OTHER PUBLICATIONS

"Siemens Datasheet TEMPFET BTS 120", https://datasheetspdf.com/datasheet/BTS120.html, 2016, 1-9.
"Smart Low Side Power Switch", Infineon Datasheet HITFET BTS-141, Revision 1.4, Jul. 11, 2012, pp. 1-11.
(Continued)

*Primary Examiner* — Jared Fureman
*Assistant Examiner* — Christopher J Clark
(74) *Attorney, Agent, or Firm* — Murphy, Bilak & Homiller, PLLC

(57) ABSTRACT

A device is provided that includes a power transistor and an overcurrent detection logic. The overcurrent detection logic has a first stable state providing a first signal level on a status output terminal and a second stable state providing a second signal level on the status output terminal. The overcurrent detection logic changes from the first stable state to the second stable state in response to detecting that a current through the power transistor exceeds a current limit. The overcurrent detection logic remains in the second state when the current through the transistor drops below the limit after exceeding the current limit.

14 Claims, 6 Drawing Sheets

(56) References Cited

OTHER PUBLICATIONS

Choi, Ui-Min, et al., "Study and Handling Methods of Power IGBT Module Failures in Power Electronic Converter Systems", IEEE Transactions On Power Electronics, vol. 30, No. 5, May 2015, pp. 2517-2533.

Lu, Bin, et al., "A Literature Review of IGBT Fault Diagnostic and Protection Methods for Power Inverters", IEEE Transactions on Industry Applications, vol. 45, No. 5, Sep./Oct. 2009, pp. 1770-1777.

Sadik, Diane-Perle, et al., "Short-Circuit Protection Circuits for Silicon-Carbide Power Transistors", IEEE Transactions on Industrial Electronics, vol. 63, No. 4, Apr. 2016, pp. 1995-2004.

Wang, Zhiqiang, et al., "Design and Performance Evaluation of Overcurrent Protection Schemes for Silicon Carbide (SiC) Power MOSFETs", IEEE Transactions on Industrial Electronics, vol. 61, No. 10, Oct. 2014, pp. 5570-5581.

Zhang, Xuan, et al., "A 15 kV SiC MOSFET Gate Drive with Power over Fiber based Isolated Power Supply and Comprehensive Protection Functions", 2016 IEEE Applied Power Electronics Conference and Exposition (APEC), Mar. 20-24, 2016, pp. 1967-1973.

"Smart Highside High Current Power Switch", Infineon Data Sheet BTS50055-1TMC, Apr. 27, 2010, 1-17.

\* cited by examiner

DEVICE INCLUDING POWER TRANSISTOR AND OVERCURRENT DETECTION LOGIC AND METHOD FOR OPERATING A POWER TRANSISTOR

TECHNICAL FIELD

The present application relates to devices including a power transistor and an overcurrent detection logic, and to corresponding methods for operating a power transistor.

BACKGROUND

Power transistors nowadays are used in many applications to switch high voltages or currents, for example to selectively provide power to a load. Power, as used herein, refers to electrical power unless noted otherwise. Such power transistors are designed to be able to carry comparatively large currents, to be able to switch high voltages or both.

In some applications, instead of silicon-based power transistor like metal oxide silicon field-effect transistors (MOSFETs), transistors based on a wide bandgap material, for example silicon carbide, are used. Such wide bandgap material based power transistors exhibit a lower on-resistance than power transistors based on silicon.

When a current through a power transistor exceeds a specified current range the power transistor is designed for, damage or even destruction of the power transistor may result. Such a current exceeding the specified current range is also referred to as overcurrent. Overcurrent may for example be caused by a short circuit, when only a very small load (for example only a wire) is supplied by a switched-on power transistor.

This is especially critical for wide bandgap material based power transistors, as due to the lower on-resistance in case of a short circuit the current may rise very fast and may exceed a specified current range for example within 5 µs.

Generally, for overcurrent protection, when an overcurrent is detected the respective power transistor is switched off. For detecting the overcurrent connection, various conventional approaches have been employed.

One conventional approach is referred to as desaturation (DESAT) detection. This approach requires a specific external circuitry which may complicate the implementation and use of a gate driver and which may increase area requirements and costs.

In other approaches, sense structures on the chip, like sense transistors are used. In some of these approaches, as soon as a short circuit condition is over the protection may be released and the gate driver will drive the power transistor again. If in such cases the detection threshold for overcurrent detection is above the specified current range, the power transistor may resume operation with a too high current. This may lead to damage or destruction of the power transistor.

Other approaches implement solid state circuit breakers or monitor the slope of a current through the transistor, for example at a source terminal of a transistor. These approaches also may require additional circuitry outside the power transistor and may increase costs, may require additional pins on a module, or may be too slow for wide bandgap based power transistors.

SUMMARY

According to an embodiment, a device is provided, comprising: a power transistor, an overcurrent detection logic having a first stable state providing a first signal level on a status output terminal and a second stable state providing a second signal level on the status output terminal, wherein the overcurrent detection logic is configured to change from the first stable state to the second stable state in response to detecting that a current through the transistor exceeds a current limit, and to remain in the second state when the current through the power transistor drops below the current limit after exceeding the current limit.

According to another embodiment, a method for operating a power transistor is provided, comprising: detecting an overcurrent condition, and in response to detecting the overcurrent condition, switching a signal level at a status output terminal from a first stable state signal level to a second stable state signal level, wherein the signal level at the status output terminal remains at the second stable state signal level after the overcurrent condition has passed.

The above summary is merely intended to give a brief overview over some embodiments and is not to be construed as limiting in any way.

DETAILED DESCRIPTION

Figure 1:
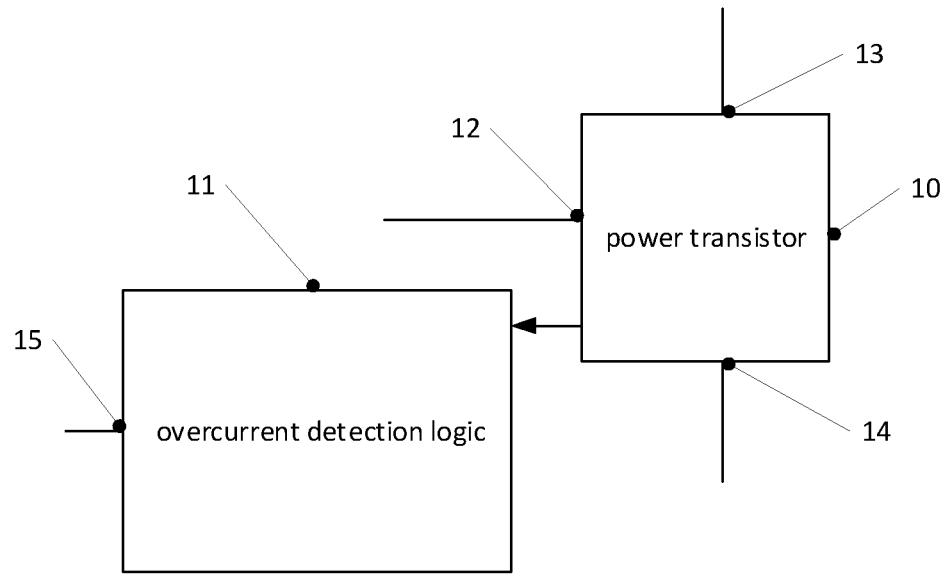
FIG. 1 is a block diagram of a device according to an embodiment.

In the following, various embodiments will be discussed in detail referring to the attached drawings. It is to be understood that these embodiments are given by way of example only and are not to be construed in any limiting sense.

Describing an embodiment with a plurality of features (for example components, devices, elements, acts or events) is not to be construed as indicating that all those features are necessary for the implementation of embodiments. Instead, in other embodiments, some of the features may be omitted, or may be replaced by alternative features. Furthermore, in addition to the features explicitly shown and described, further features, for example features used in conventional devices including power transistors, may be provided. For example, while examples for overcurrent protection logic according to various embodiments are described herein, in other embodiments in addition to such an overcurrent protection logic a conventional overcurrent protection scheme may be implemented to provide redundancy.

Connections or couplings as described herein refer to electrical connections or couplings unless noted otherwise. Such connections or couplings may be modified, for example by removing circuit elements or by adding circuit elements, as long as the general purpose of the connection or coupling, for example to provide a certain signal, to provide a certain kind of control, to provide a voltage etc. is essentially maintained. In other words, connections or couplings may be modified as long as their function is essentially preserved.

Various embodiments described herein use one or more transistors. Generically, transistors are described as including two load terminals and a control terminal. By applying signals (voltages and/or currents) to the control terminal, the transistor may be switched between an on state and an off state. In the on state, the transistor provides a low ohmic connection between its load terminals. The remaining resistance between the load terminals is referred to as on-resistance. In an off state, the transistor essentially provides an electrical isolation (apart from possible small leakage currents, which, if present, are several orders of magnitude lower than currents flowing in an on state).

While embodiments described below use field-effect transistors (FETs), for example metal oxide semiconductor field effect transistors (MOSFETs), also other types of transistors like bipolar junction transistors (BJTs) or insulated gate bipolar transistors (IGBTs) may be used in other embodiments. In case of field-effect transistors, the load terminals mentioned above are the source and drain terminals of the field effect transistors, and the control terminal is the gate terminal of the field-effect transistor. In case of a bipolar junction transistor, the load terminals are the collector and emitter terminals, and the control terminal is the base terminal. In case of an insulated gate bipolar transistor, the load terminals are the collector and emitter terminals, and the control terminal is the gate terminal.

Transistors may be based on various materials like silicon, silicon carbide (SiC), or III-V compounds like gallium arsenide or gallium nitride. Embodiments discussed herein may be particularly applicable to transistors based on a wide bandgap material like silicon carbide or gallium nitride, which in many implementations have a lower on-resistance like corresponding transistors based on silicon. As used herein, wide bandgap materials refer to materials where the fundamental bandgap is greater than 1.5 eV, for example greater than 3 eV, at 300 Kelvin. For example, at 300 K the fundamental bandgap of silicon carbide is 3.03 eV, and of gallium nitride is 3.37 eV.

Embodiments relate to an overcurrent detection for power transistors. A power transistor, as mentioned in the background section, is a transistor which is designed to switch high currents or voltages, for example currents of several amperes and/or high voltages, up to 1000 V. In particular, as used herein a power transistor has a blocking voltage of at least 450 V, for example between 650 and 1200 V, for example up to 3.3 kV. The blocking voltage is a voltage that, in an off state of the power transistor, may be applied between its load terminals without breakdown, i.e. preserving the electrical isolation between the load terminals.

Turning now to the Figures, FIG. 1 is a block diagram of a device according to an embodiment.

The device of FIG. 1 comprises a power transistor 10. Power transistor 10 may be controlled at a control terminal 12 to selectively electrically couple a first load terminal 13 to a second load terminal 14. For example, in some implementations power supply transistor 10 may be coupled to a power source at first load terminal 13 and to a load at second load terminal 14, or to a load coupled in series with a power source at the first load terminal 13 and with ground at the second load terminal 14, to selectively provide the load with power.

In case of a short circuit, for example if a load coupled to first load terminal 13 or second load terminal 14 is short-circuited, an overcurrent condition as explained above may occur.

To detect such an overcurrent condition, the device of FIG. 1 includes a bistable overcurrent detection logic 11.

Bistable means that the overcurrent detection logic 11 has a first stable state and a second stable state. A stable state is a state which, in the absence of specific conditions triggering a change of state, remains stable. In the first stable state, overcurrent detection logic 11 outputs a first signal level at a status output terminal 15, and in the second stable state, overcurrent detection logic 11 outputs a second signal level at status output terminal 15. The first signal level may correspond to a no overcurrent condition, while the second signal level corresponds to an overcurrent condition. Correspondingly, during normal operation, bistable overcurrent detection logic 11 is in the first state. When bistable overcurrent detection logic 11 detects an overcurrent condition of power transistor 10, overcurrent detection logic 11 transitions to the second stable state, such that the second signal level is output at status output terminal 15. This change of signal level at status output terminal 15 may for example be detected by a driver driving power transistor 10, and the driver may then switch off power transistor 10 in response to the second the signal level at status output terminal 15.

As the second state is a stable state, when the overcurrent condition is over, for example the current through power transistor 10 falls below an overcurrent threshold, overcurrent detection logic 11 remains in the second state. This in some embodiments avoids problems that may occur in some conventional approaches, where, when the overcurrent condition is over, a driver may automatically turn on again, which may lead to a current level above the threshold being applied again.

To reset overcurrent detection logic 11 back to the first state, a specific signal has to be applied to overcurrent detection logic 11, or a specific action has to be taken. For example, a signal may be applied to status output terminal 15, and/or a power supply to overcurrent detection logic 11 may be temporarily interrupted to cease to supply power to overcurrent detection logic 11, for example by switching off the power supply or interrupting a connection between the power supply and overcurrent detection logic 11, to reset overcurrent detection logic 11 back to the first state. Example implementations for overcurrent detection logic 11 operating in this manner will be discussed later referring to FIGS. 4 to 9.

Figure 2:
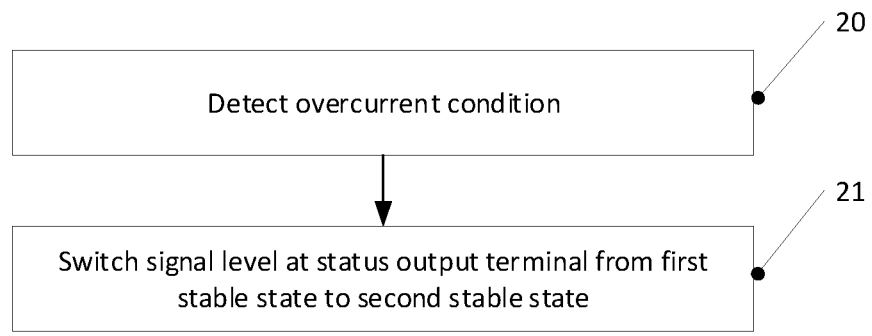
FIG. 2 is a flowchart illustrating a method according to some embodiments.

FIG. 2 is a flowchart illustrating a method according to some embodiments. The method of FIG. 2 may be implemented in the device of FIG. 1 or any of the devices discussed further below, but is not limited thereto. In order to avoid repetitions, the method of FIG. 2 will be discussed with reference to the previous explanations.

At 20 in FIG. 2, the method comprises detecting an overcurrent condition, for example detecting that a current through a power transistor exceeds a predefined overcurrent threshold. At 21, in response to detecting the overcurrent condition at 20, a signal level at a status output terminal, for example status output terminal 15, is switched from a first stable state signal level, i.e. a signal level associated with a first stable state of overcurrent detection, to a second stable state signal level, essentially as explained above for overcurrent detection logic 11. When the overcurrent condition is over, the signal level at the status output terminal remains at the second stable state signal level until a specific signal is provided to set the signal level to the first stable state signal level or a specific action is taken, as also explained above referring to FIG. 1.

Figure 3A:
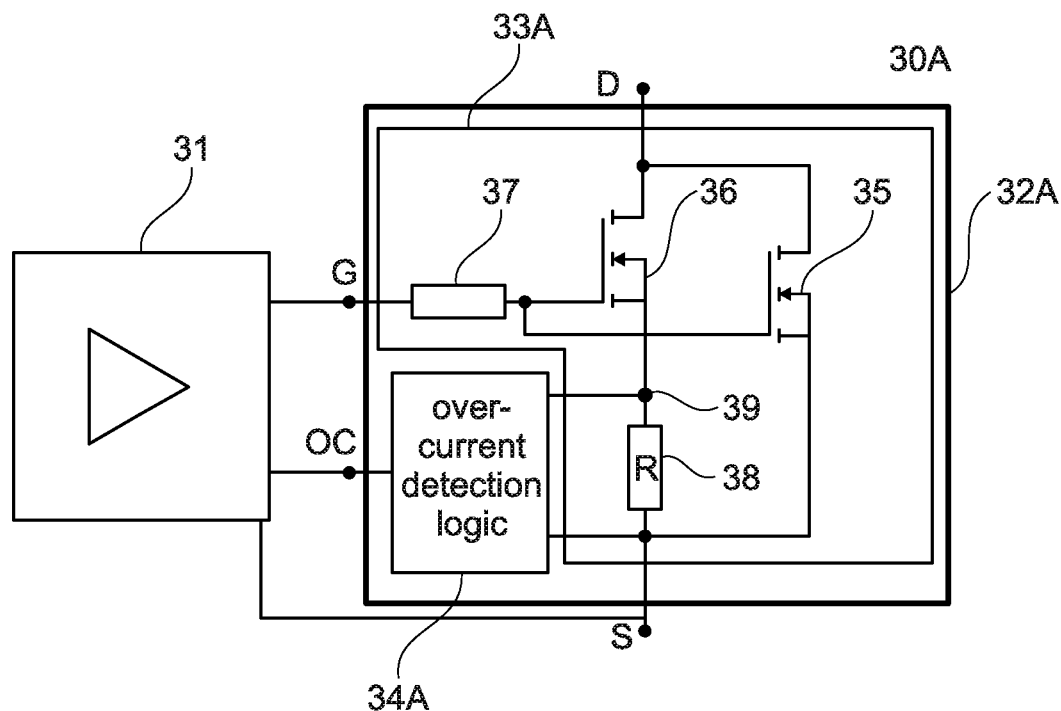
FIGS. 3A to 3C are diagrams illustrating devices according to various embodiments.
Figure 3B:
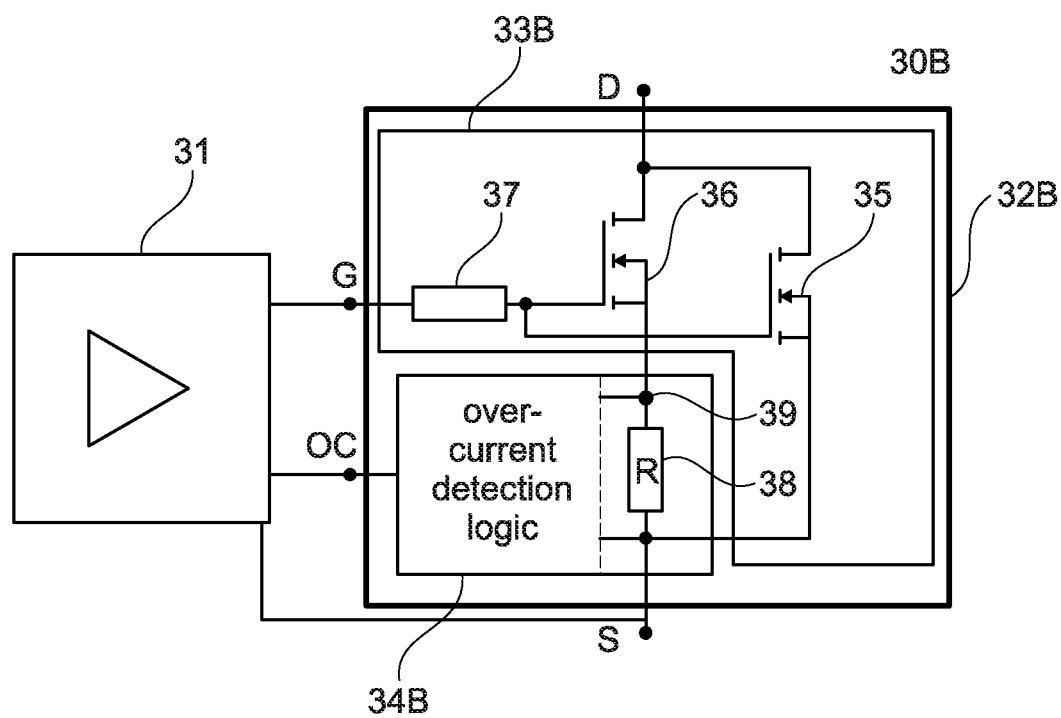
Figure 3C:
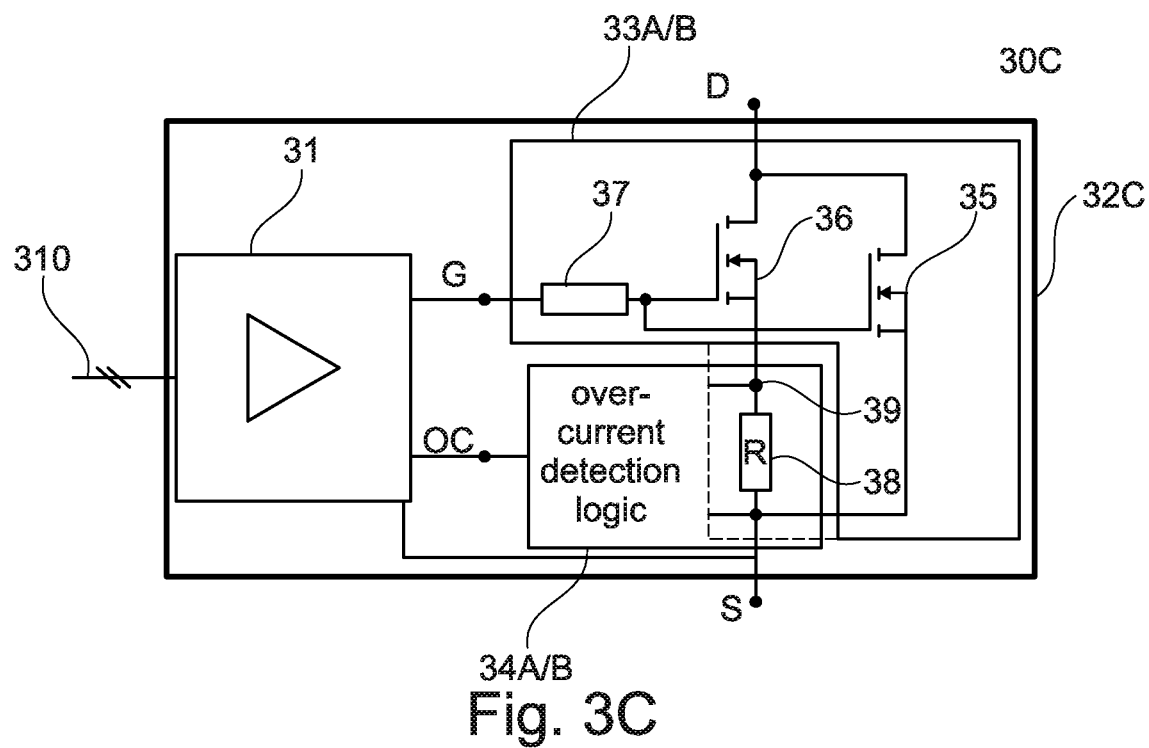

FIG. 3A to 3C illustrate various configurations of devices according to embodiments. In order to avoid repetitions, in FIGS. 3A to 3C like elements are designated with the same reference numerals and will not be described again.

FIG. 3A shows a device 30A according to an embodiment. Device 30A of FIG. 3A comprises a module or package 32A and a driver 31, which is provided outside module or package 32A.

Package or module 32A, in the following shortly referred to simply as module 32A, includes a gate resistor 37, a power transistor 35, a sense transistor 36 and a sense resistor 38. These components 35-38 in the example of FIG. 3A are implemented on a first chip die 33A. In some implementations, power transistor 35 and sense transistor 36 may be silicon carbide (SiC) transistors, and first chip 33A may be a silicon carbide chip. Furthermore, module 32A includes an overcurrent detection logic 34A, which may be implemented on a second chip die, which is provided with first chip die 33A in a chip-on-chip or chip-by-chip configuration. The second chip die where overcurrent detection logic 34A is implemented may be a silicon chip die. In cases where power transistor 35 is a silicon power transistor, instead of the first chip die and the second chip die a single chip die may be provided. However, when power transistor 35 is a wide bandgap transistor like a SiC transistor, providing two chip dies enables the overcurrent detection logic 34A to be implemented in silicon, which may be cheaper than an implementation of overcurrent detection logic 34A on a silicon carbide chip die.

Sense transistor 36 is scaled with respect to power transistor 35, i.e. its dimensions are reduced by a scaling factor (for example a scaling factor of 10, 100 or more). Power transistor 35 and sense transistor 36 are driven by gate driver 31 via a terminal G of module 32A, to selectively couple drain terminal D of module 32A to source terminal S of module 32A, for example to couple a load connected to source terminal S selectively to a power source coupled to drain terminal D. To selectively switch on and off power transistor 35, in particular a corresponding gate current is supplied or drawn via gate resistor 37. The same control is provided to sense transistor 36, such that power transistor 35 and sense transistor 36 are switched concurrently. With the coupling as shown in FIG. 3A, a current through sense transistor 36 is proportional to the current through power transistor 35, wherein the proportionality depends on the scaling factor, which is known by design. Therefore, by measuring a current through sense resistor 36, a current through power transistor 35 may be measured.

In the embodiment of FIG. 3A, the current is measured as a voltage drop across sense resistor 38, between a node 39, which lies between sense transistor 36 and sense resistor 38, and source terminal S. Other approaches to measuring the current, for example using a magnetic field sensor to measure a magnetic field generated by the current, may also be employed.

Overcurrent detection logic 34A is a bistable overcurrent detection logic as described already for bistable overcurrent detection logic 11 of FIG. 1, i.e. it has a first stable state in which a first signal level is output at a status output terminal OC, and a second stable state where a second signal level is output at status output terminal OC. In normal operation, overcurrent detection logic 34A is in the first stable state, and therefore the signal level at status output terminal OC is at the first signal level, which indicates no overcurrent condition. In case an overcurrent is detected, for example when the voltage across sense resistor 38 exceeds a predefined threshold, corresponding to the current through power transistor 35 exceeding an overcurrent threshold, overcurrent detection logic 34A changes to the second stable state, and correspondingly the signal level at status output OC changes to the second signal level. Driver 31 detects this second signal level and in response thereto switches power transistor 35 (and sense transistor 36) off. If the current and therefore the voltage across sense resistor 38 drops afterwards, for example in response to switching off power transistor 35, nevertheless overcurrent detection logic 34A remains in the second stable state. To set overcurrent detection logic 34A to the first stable state again, for example a specific signal has to be applied to status output terminal OC by driver 31 or another entity. Instead of using status output terminal OC for this resetting to the first stable state, also an additional terminal may be provided for this purpose, although this increases the pin count of module 32A.

FIG. 3B shows a device 30B, which is a variation of device 30A of FIG. 3A. Therefore, only the differences to device 30A will be described, and remaining parts and operation of device 30B corresponds to the one of device 30A.

Device 30B includes a module 32B, which includes a first chip die 33B, which similar to first chip die 33A of FIG. 3A may be a silicon carbide chip die, although other materials may also be used. In contrast to first chip die 33A, first chip die 33B includes only gate resistor 37, sense transistor 36 and power transistor 35. Sense resistor 38 in device 30B is implemented together with overcurrent detection logic 34B on a second chip die. Otherwise, operation and configuration corresponds to the one of FIG. 3A.

FIG. 3C illustrates a further variation. A device 30C of FIG. 3C includes a module 32C. In this case, driver 31 is included in module 32C, which is controlled via a terminal 210 providing some control signal (for example a pulse width modulated signal) to driver 31. In response to this control signal, driver 31 controls power transistor 35 and sense transistor 36.

Otherwise, the configuration of a first chip die and a second chip die may be as in FIG. 3A or as in FIG. 3C, illustrated by dashed lines and a first die 33A/B and an overcurrent detection logic 34A/B in FIG. 3C, indicating that both the configuration of FIG. 3A and the configuration of FIG. 3B may be used for the first and second chip dies.

Next, implementation examples for an overcurrent detection logic with two stable states will be given referring to FIGS. 4-9. In order to avoid repetitions, reference will be made to the previous explanations when explaining FIGS. 4-9.

Figure 4:
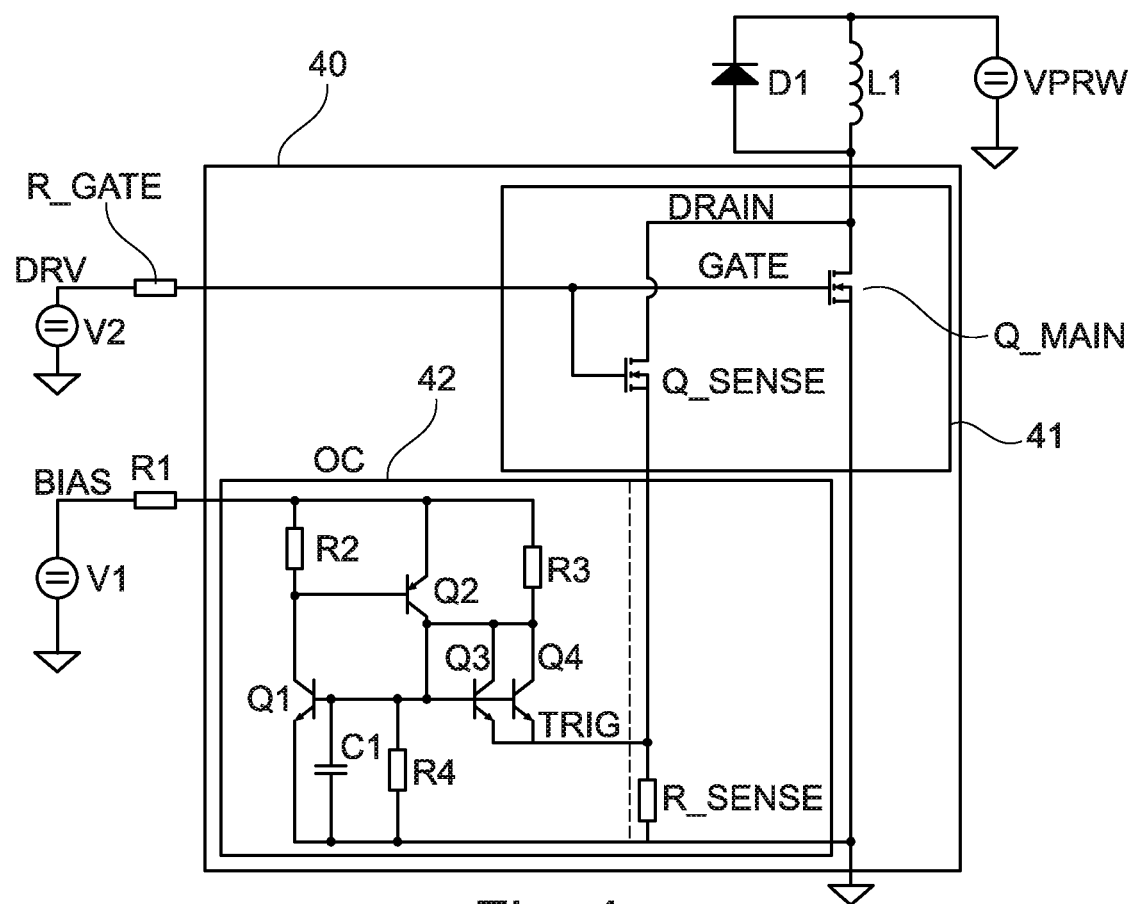
FIG. 4 is a circuit diagram illustrating a device according to an embodiment.

The device of FIG. 4 comprises a module 40 including a first chip die 41 and a second chip die 42. First chip die 41 may be a silicon carbide based chip die or a chip die based on another wide bandgap semiconductor, but is not limited thereto, and includes a power transistor Q_MAIN and a sense transistor Q_SENSE. Power transistor Q_MAIN and sense transistor Q_SENSE in their function correspond to power transistor 35 and sense transistor 36 of FIGS. 3A to 3C. Power transistor Q_MAIN and sense transistor Q_SENSE are driven by a driving signal DRV generated by a driver, represented by a voltage source V2, via a gate resistor R_GATE. While in the embodiment of FIG. 4 gate resistor R_GATE is external to module 40, in other embodiments, similar to FIGS. 3A-3C, gate resistor R_GATE may be provided on first chip die 41.

A second chip die 42 includes a sense resistor R_SENSE, which corresponds to sense resistor 38 of FIGS. 3A and 3C. In the example of FIG. 4, sense resistor R_SENSE is provided on second chip die 42. However, as shown in FIG. 3A, sense resistor R_SENSE in other implementations may be provided on first chip die 41. Second chip die 42 may be a silicon chip die.

Furthermore, second chip die 42 includes an overcurrent detection logic including transistors Q1 to Q4, resistors R2, R3, R4 and a capacitor C1. Current mode detection logic 41 in this case is supplied at a status output terminal OC by a voltage source V1 via a resistor R1. To give some non-limiting example, transistors Q1-Q4 may be bipolar transistors, resistor R1 may have a resistance of 500Ω, resistor R2 may have a resistance of 2 kΩ, resistor R3 may have a resistance of 100 kΩ and resistor R4 may have a resistance of 22 kΩ. Capacitor C1 may have a capacitance of 22 pF. Sense resistor R_SENSE may have a resistance of 10Ω. In yet other embodiments, in addition to external gate resistor R_GATE a further gate resistor may be provided within first chip die 41. Voltage V1 may for example be a supply voltage of 5 V.

Transistors Q1, Q2, Q3, Q4, capacitor C1 and resistors R2, R3 and R4 form a latching current mirror structure which is triggered when a voltage TRIG at a node between sense transistor Q_SENSE and sense resistor R_SENSE exceeds a predefined value, where the predefined value is determined by the values of the resistors used. At the heart of this latching structure, transistors Q1 and Q2 form a thyristor, sometimes also referred to as silicon controlled rectifier (SCR), which is triggered by a voltage TRIG exceeding a predefined threshold, which corresponds to a current through power transistor Q_MAIN exceeding a predefined current threshold. In this case, a voltage at status output terminal OC changes from a first voltage level to a second voltage level. For resetting the voltage to a first value, in the example of FIG. 4 the voltage source V1 may be temporarily disconnected, thus, ceasing to supply power to the overcurrent detection logic.

Furthermore, the embodiment of FIG. 4 includes a load represented by an inductor L1 and a diode D1 coupled to a drain terminal of power transistor Q_MAIN and supplied by a voltage VPRW. In this case, power transistor Q_MAIN is coupled between this load and ground, and if power transistor Q_MAIN is switched on, current may flow from voltage source VPRW to the load to ground.

An overcurrent condition as mentioned above may occur when the load is very low, for example if L1 is simply the inductance of a wire, corresponding to a short circuit. In this case, the overcurrent protection logic triggers, and the driver symbolized by voltage source V2 may detect the change of signal level at status output terminal OC and switch power switch Q_MAIN off.

Figure 5:
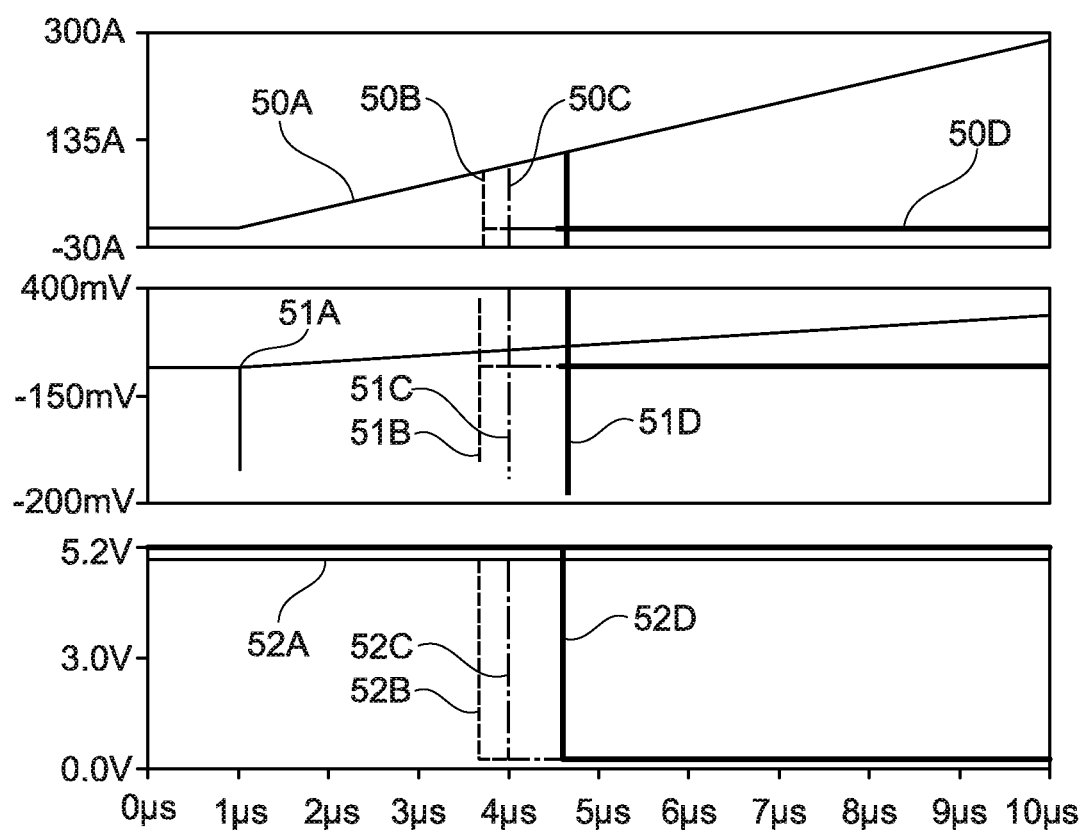
FIG. 5 illustrates example signals for the embodiment of FIG. 4.

FIG. 5 illustrates examples for the operation of the embodiment of FIG. 4, based on simulations. Curves 50A to 50B show the current through power transistor Q_MAIN for different overcurrent thresholds, curves 51A to 51D show the voltage across the sense resistor R_SENSE, and curves 52A to 52D show the voltage at the status output terminal OC for the different connections. Curves belonging to the same overcurrent detection threshold have the same letter, i.e. A, B, C or D. Curves "A" show a case without threshold, i.e. with the overcurrent detection turned off. In this case, as shown by curve 50A, the current through the transistors continues to rise, essentially until the transistor cannot bear the current and is damaged or destroyed. Correspondingly, in curve 51A, the voltage across the sense resistor R_SENSE continuously increases, corresponding to the continuously rising current according to curve 50A. Further correspondingly, according to curve 52A the voltage level at the status output terminal remains at a high voltage corresponding to the supply voltage provided by voltage source V1.

Curves B to D represent the situation with an overcurrent threshold, where the overcurrent threshold is lowest for curves B, highest for curves D and in between for curves C. As can be seen in curves 50B-50D, when the overcurrent threshold is reached, a driver switches the transistor Q_MAIN off, and therefore, the current drops to 0 A. In this way, damage to the power transistor may be prevented. At the same time, as shown in curves 51B-51D, the voltage across sense resistor S_SENSE drops to a value representing essentially 0 current. Furthermore, when the overcurrent threshold is reached, as represented by curves 52B-52D, the voltage at status output terminal OC drops to 0 V (second signal level) when the overcurrent threshold is reached (this drop actually is slightly earlier than the drops in curves 50 and 50C, as this drop causes the driver to recognize the overcurrent condition and switch the power transistor off).

It should be noted that the resistance value of resistor R_SENSE in typical implementations of such resistors is depending on temperature and in particular rise with rising temperature. This means that the voltage drop across resistor R_SENSE is higher with rising temperatures. For the same overcurrent threshold, this means that the overcurrent detection logic triggers at lower current thresholds or, in other words, the effective current threshold is temperature dependent. As for higher temperatures power transistor Q_MAIN may be more prone to being damaged by overcurrents, this may be a beneficial effect, such when the module is heated, the overcurrent threshold is lower.

Figure 6:
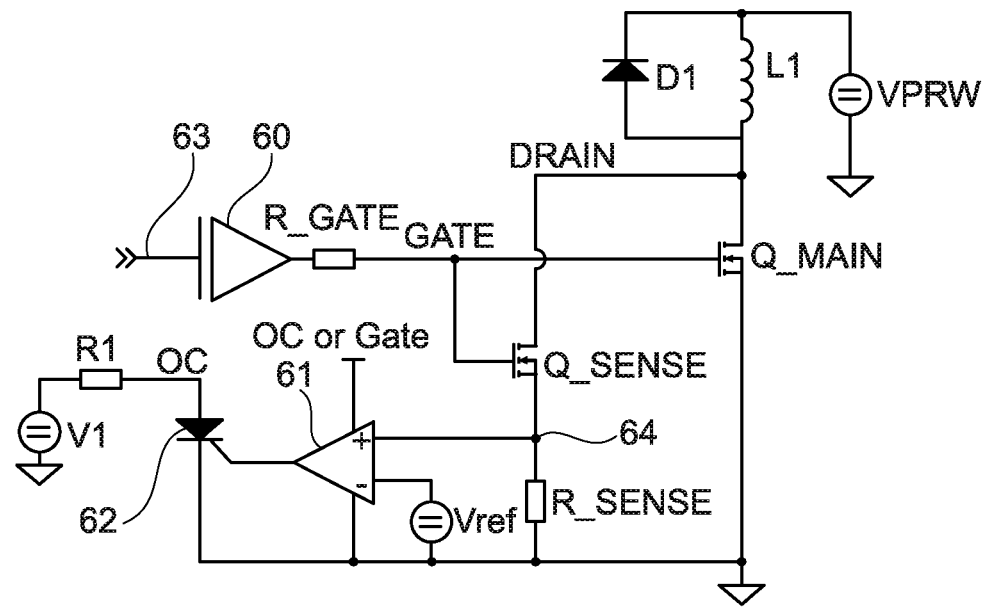
FIGS. 6 to 9 are circuit diagrams illustrating devices according to various embodiments.

FIG. 6 is a circuit diagram illustrating a further embodiment of an overcurrent detection logic. In FIG. 6 and also in following FIGS. 7-9, features not explicitly described again have the same function as described for FIG. 4. In particular, all embodiments of FIG. 6-9 include a power transistor Q_MAIN, a sense transistor Q_SENSE, a sense resistor R_SENSE, a voltage source V1 supplying an overcurrent detection logic at a status output terminal OC via a resistor R1, and a gate resistance R_GATE, with the same functions and purposes as described for FIG. 4.

In the embodiment of FIG. 6, power transistor Q_MAIN and sense resistor Q_SENSE are driven by a gate driver 60, which is controlled by some controller at a terminal 63. An overcurrent detection logic includes a comparator 61 comparing the voltage at a node 64 between sense transistor Q_SENSE and sense resistor R_SENSE with a reference voltage VRef. Reference voltage VRef determines the overcurrent threshold. When the voltage at the node 64 exceeds the voltage VRef, comparator 61 triggers a thyristor 62 which then sets the voltage at the status output terminal OC to ground (second signal level). This may be detected by driver 60 or the above-mentioned controller to cause driver 60 to switch off power transistor Q_MAIN. Thyristor 62 remains in the conducting state coupling status output terminal OC to ground until the supply voltage V1 at the status output terminal OC is disconnected. Comparator 61 may be supplied by the voltage source V1 at status output terminal OC or may also be supplied by the voltage at the gate terminal of power transistor Q_MAIN (when Q_MAIN is switched off, this means that comparator 61 is not supplied, but conversely, when Q_MAIN is switched off, no overcurrent situation can occur, such that the overcurrent detection logic may be switched off.)

Figure 7:
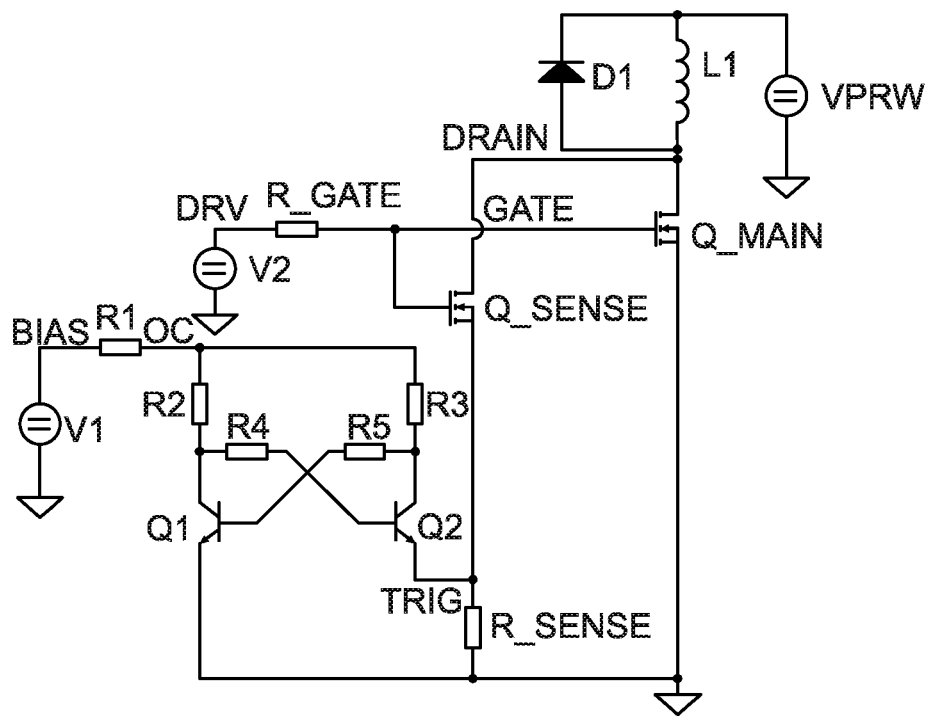

FIG. 7 illustrates a further embodiment. In FIG. 7, similar to FIG. 4 the driver is represented by a voltage source V2. Furthermore, in FIG. 7, the overcurrent detection logic is implemented as a latch with cross-coupled transistors Q1 and Q2 and resistors R2, R3, R4 and R5 coupled as shown. R2 may for example have a value of 100Ω, R3 may have a value of 10 kΩ, and R4 and R5 may also values of 10 kΩ. The values of R2 and R3 may determine the overcurrent threshold.

Figure 8:
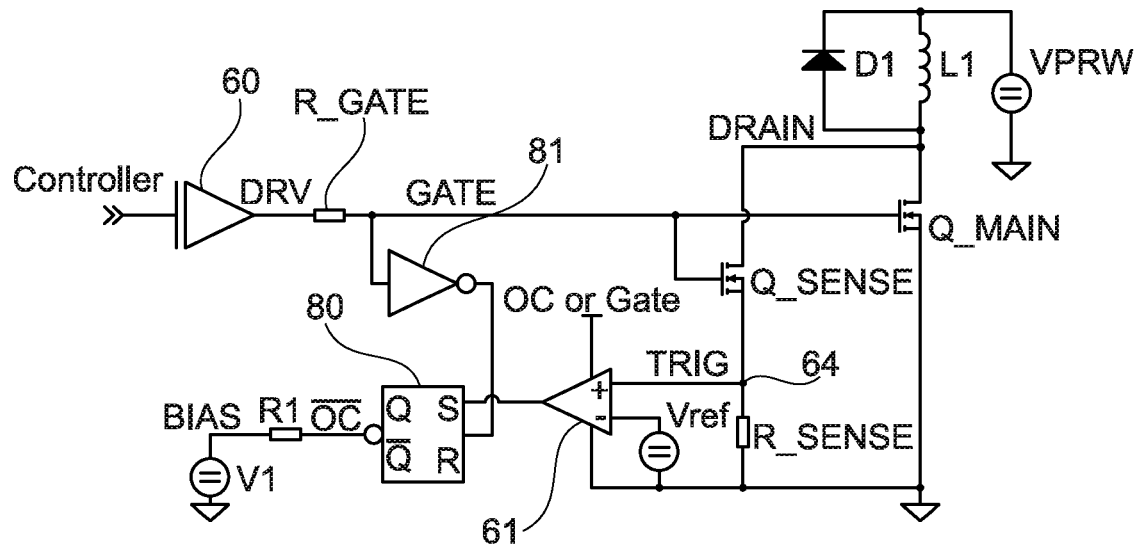

FIG. 8 illustrates a further embodiment. A driver 60 and a comparator 61 are provided with the same function as described referring to FIG. 6. In this case, the output of comparator 61 triggers a set/reset latch 80 at a set input S thereof. A reset input of latch 80 is coupled to an output of driver 60 via an inverter 81 as shown. An inverted output Q provides an inverted status output terminal OC and receives the voltage from voltage source V1, which voltage source has been described previously. The effect of this structure is the same as described with respect to FIG. 4.

Figure 9:
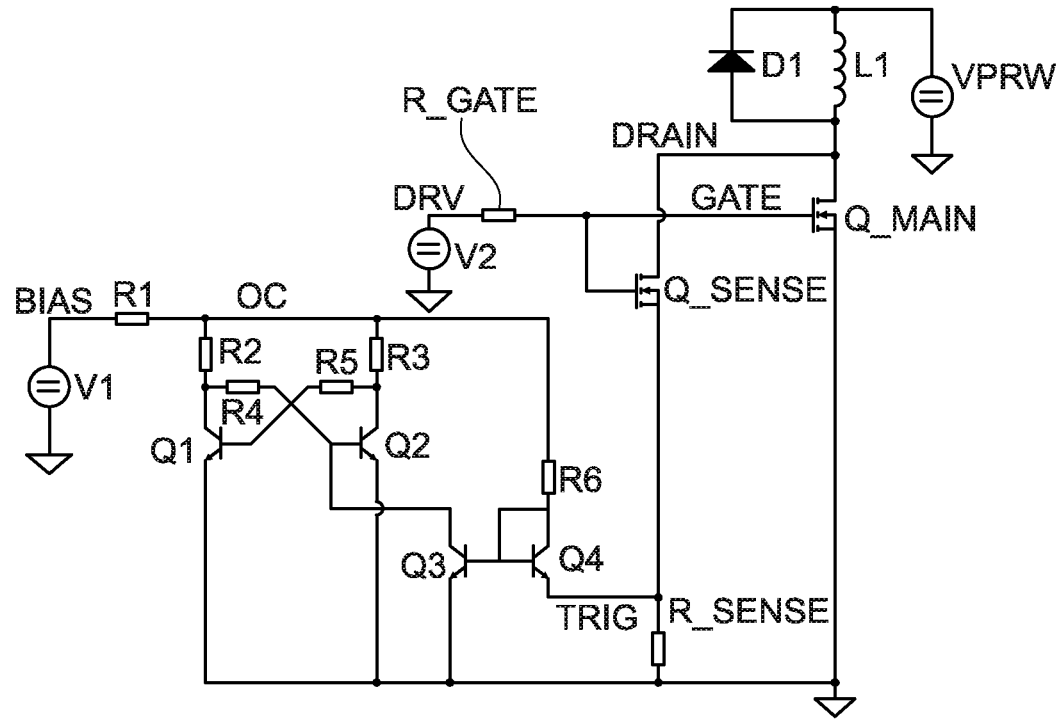

FIG. 9 illustrates a further embodiment. In FIG. 9, similar to FIG. 4 the driver is represented by a voltage source V2. In the embodiment of FIG. 8, a current mirror of transistors Q3 and Q4 together with a resistor R6 serves as a comparator triggering a latch including cross-coupled transistors Q1-Q2 and resistors R2, R3, R4 and R5. Resistors R2, R3, R4 and R5 may have the same values as described with respect to FIG. 7 for resistors R2, R3, R4 and R5. Resistor R6 may for example have a value of about 20 kΩ.

It should be noted that any values given for example for resistances or capacitances in the above description serve only as illustrative examples, and in other implementations other values may be used, for example to obtain different threshold values or to adapt the circuit to different voltages.

Some embodiments are defined by the following examples:

Example 1. A device, comprising: a power transistor, an overcurrent detection logic having a first stable state providing a first signal level on a status output terminal and a second stable state providing a second signal level on the status output terminal, wherein the overcurrent detection logic is configured to change from the first stable state to the second stable state in response to detecting that a current through the transistor exceeds a current limit, and to remain in the second state when the current through the power transistor drops below the current limit after exceeding the current limit.

Example 2. The device of Example 1, wherein the device is provided in a single package or module.

Example 3. The device of any one of Examples 1 or 2, wherein the overcurrent detection logic is configured to be reset from the second state to the first state via an external terminal of the device.

Example 4. The device of Example 3, wherein the external terminal is the status output terminal.

Example 5. The device of any one of Examples 1 to 4, wherein the current detection logic is configured to be reset from the second state to the first state by ceasing to supply power to the current detection logic.

Example 6. The device of any one of Examples 1 to 5, wherein the current detection logic is configured to be supplied with power via the status output terminal.

Example 7. The device of any one of Examples 1 to 6, wherein the current detection logic comprises a latching thyristor configured to latch the second state.

Example 8. The device of any one of Examples 1 to 7, wherein the current detection logic comprises a comparator and a latch, wherein an output of the comparator is configured to trigger the latch.

Example 9. The device of any one of Examples 1 to 8, wherein the power transistor is a wide bandgap material based power transistor.

Example 10. The device of any one of Examples 1 to 9, wherein the power transistor is implemented on a first chip die, and the overcurrent detection logic is implemented on a second chip die in a chip-on-chip or chip-by-chip arrangement with the first chip die.

Example 11. The device of any one of Examples 1 to 10, further comprising a driver circuit coupled to the output terminal configured to drive the power transistor and to switch the power transistor off when the status output terminal is at the second signal level.

Example 12. The device of any of Examples 1 to 11, further comprising a sense transistor coupled in parallel to the power transistor and being scaled with respect to the power transistor, and a sense resistor coupled in series to the sense transistor, wherein the overcurrent detection logic is configured to detect when the current through the transistor exceeds the current limit based on a voltage drop across the sense resistor.

Example 13. The device of Example 11 and of Example 12, wherein the sense transistor is implemented on the first chip die, and wherein the sense resistor is implemented on one of the first chip die or the second chip die.

Example 14. A method for operating a power transistor, comprising: detecting an overcurrent condition, and in response to detecting the overcurrent condition, switching a signal level at a status output terminal from a first stable state signal level to a second stable state signal level, wherein the signal level at the status output terminal remains at the second stable state signal level after the overcurrent condition has passed.

Example 15. The method of Example 14, further comprising resetting the signal level from the second stable state signal level to the first stable state signal level.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
    a power transistor; and
    an overcurrent detection logic having a first stable state providing a first signal level on a status output terminal and a second stable state providing a second signal level on the status output terminal, wherein the overcurrent detection logic is configured to:
        change from the first stable state to the second stable state in response to detecting that a current through the transistor exceeds a current limit; and
        to remain in the second state when the current through the power transistor drops below the current limit after exceeding the current limit,
    wherein the overcurrent detection logic is configured to be reset from the second state to the first state via an external terminal of the device,
    wherein the external terminal is the status output terminal.

2. The device of claim 1, wherein the device is provided in a single package or module.

3. The device of claim 1, wherein the current detection logic is configured to be reset from the second state to the first state by ceasing to supply power to the current detection logic.

4. The device of claim 1, wherein the current detection logic is configured to be supplied with power via the status output terminal.

5. The device of claim 1, wherein the current detection logic comprises a latching thyristor configured to latch the second state.

6. The device of claim 1, wherein the current detection logic comprises a comparator and a latch, wherein an output of the comparator is configured to trigger the latch.

7. The device of claim 1, wherein the power transistor is a wide bandgap material based power transistor.

8. The device of claim 1, wherein the power transistor is implemented on a first chip die, and wherein the overcurrent detection logic is implemented on a second chip die in a chip-on-chip or chip-by-chip arrangement with the first chip die.

9. The device of claim 1, further comprising a driver circuit coupled to the output terminal configured to drive the power transistor and to switch the power transistor off when the status output terminal is at the second signal level.

10. The device of claim 1, further comprising:
a sense transistor coupled in parallel to the power transistor and being scaled with respect to the power transistor; and
a sense resistor coupled in series to the sense transistor, wherein the overcurrent detection logic is configured to detect when the current through the transistor exceeds the current limit based on a voltage drop across the sense resistor.

11. The device of claim 1, wherein the power transistor is implemented on a first chip die, wherein the overcurrent detection logic is implemented on a second chip die in a chip-on-chip or chip-by-chip arrangement with the first chip die, and wherein the device further comprises:
a sense transistor coupled in parallel to the power transistor and being scaled with respect to the power transistor; and
a sense resistor coupled in series to the sense transistor, wherein the overcurrent detection logic is configured to detect when the current through the transistor exceeds the current limit based on a voltage drop across the sense resistor.

12. The device of claim 11, wherein the sense transistor is implemented on the first chip die, and wherein the sense resistor is implemented on one of the first chip die or the second chip die.

13. A method for operating a power transistor, the method comprising:
detecting an overcurrent condition; and
in response to detecting the overcurrent condition, switching a signal level at a status output terminal from a first stable state signal level to a second stable state signal level, wherein the signal level at the status output terminal remains at the second stable state signal level after the overcurrent condition has passed,
wherein the signal level at the status output terminal is configured to be reset from the second stable state signal level to the first stable state signal level via an external terminal of the device,
wherein the external terminal is the status output terminal.

14. A device, comprising:
a power transistor; and
an overcurrent detection logic having a first stable state providing a first signal level on a status output terminal and a second stable state providing a second signal level on the status output terminal, wherein the overcurrent detection logic is configured to:
change from the first stable state to the second stable state in response to detecting that a current through the transistor exceeds a current limit; and
to remain in the second state when the current through the power transistor drops below the current limit after exceeding the current limit,
wherein the current detection logic comprises a latching thyristor configured to latch the second state.

* * * * *